(12) United States Patent
Lipka

(10) Patent No.: US 6,459,743 B1
(45) Date of Patent: Oct. 1, 2002

(54) DIGITAL RECEPTION WITH RADIO FREQUENCY SAMPLING

(75) Inventor: Dietmar Lipka, Berg (DE)

(73) Assignee: Telefonaktiebolaget LM Ericsson (publ), Stockhom (SE)

(*) Notice: Subject to any disclaimer, the term of this patent is extended or adjusted under 35 U.S.C. 154(b) by 0 days.

(21) Appl. No.: 09/131,205

(22) Filed: Aug. 7, 1998

(51) Int. Cl.⁷ .............................. H03D 3/22; H04L 27/22
(52) U.S. Cl. ...................... 375/329; 375/316; 375/350; 329/310
(58) Field of Search .................... 455/313, 323, 455/334; 375/247, 244, 248, 261, 316, 329, 355, 322, 320, 350, 239; 341/77, 110, 126, 143, 144, 155; 329/300, 303, 304, 310, 341; 708/300

(56) References Cited

U.S. PATENT DOCUMENTS

| | | | | |
|---|---|---|---|---|
| 4,893,316 A | * | 12/1994 | Janc et al. ................... | 708/300 |
| 5,375,146 A | * | 12/1994 | Chalmers .................... | 375/350 |
| 5,619,536 A | * | 12/1994 | Gourgue .................... | 375/316 |
| 5,841,388 A | * | 12/1994 | Yasuda ...................... | 341/155 |
| 5,910,752 A | * | 12/1994 | Filipovic et al. ............ | 329/341 |
| 5,952,947 A | * | 12/1994 | Nussbaum et al. .......... | 341/143 |
| 5,504,455 A | * | 4/1996 | Inkol ........................ | 329/304 |
| 5,557,642 A | * | 9/1996 | Williams .................... | 375/316 |
| 5,621,345 A | | 4/1997 | Lee et al. ................... | 327/254 |
| 5,734,683 A | * | 3/1998 | Hulkko et al. .............. | 375/316 |
| 5,757,867 A | | 5/1998 | Caulfield et al. ........... | 375/350 |
| 5,787,125 A | * | 7/1998 | Mittel ........................ | 375/239 |
| 6,005,506 A | * | 12/1999 | Bazarjani et al. ........... | 341/143 |

FOREIGN PATENT DOCUMENTS

| | | |
|---|---|---|
| EP | 0 650 261 A1 | 4/1995 |
| FR | 2 680 063 A | 2/1993 |

OTHER PUBLICATIONS

Richard Schreier, et al., "Decimation for Bandpass Sigma–Delta Analog–to–Digital Conversation," 1990 IEEE International Symposium on Circuits and Systems, vol. 3 of 4, New Orleans, LA, May 1–3, 1990, pp. 1801–1804.

Shengping Yang, et al., "A Tunable Bandpass Sigma–Delt A/D Conversion for Mobile Communication Receiver," IEEE Vehicular Technology Conference, vol. 2; 1994, pp. 1346–1350.

Richard Schreier, "An Empirical Study of High–Order Single–Bit Delta–Sigma Modulators," IEEE Transactions on Circuits and Systems –II: Analog and Digital Signal Processing, vol. 40, No. 8, Aug. 1993, pp. 461–466.

* cited by examiner

*Primary Examiner*—Jean Corrielus
(74) *Attorney, Agent, or Firm*—Burns, Doane, Swecker & Mathis, L.L.P.

(57) ABSTRACT

A radio frequency signal is received by using a sigma-delta analog-to-digital converter to sample the radio frequency signal at a sampling rate and to generate therefrom 1-bit digital samples representing a digital intermediate frequency signal. The intermediate frequency signal is demodulated to generate in-phase and quadrature samples. Demodulation may be performed by generating a first mixed signal by combining the 1-bit digital samples representing the intermediate frequency signal with a first sequence representing a cosine mixing signal; generating a second mixed signal by combining the 1-bit digital samples representing the intermediate frequency signal with a second sequence representing a sine mixing signal; and decimating the first and second mixed signals to generate the in-phase and quadrature samples. In alternative embodiments, the intermediate frequency signal is directly converted to in-phase and quadrature signals by using bandpass decimation filtering to subsample two time-shifted sequences of the intermediate frequency. In another alternative, the sigma-delta analog-to-digital converter uses subsampling to convert the radio frequency signal to a first intermediate frequency, and a decimation filter is used to further convert the signal to a second intermediate frequency. An IQ demodulator then reconstructs the in-phase and quadrature signals from the second intermediate frequency signal.

28 Claims, 8 Drawing Sheets

DIGITAL RECEPTION WITH RADIO FREQUENCY SAMPLING

BACKGROUND

The present invention relates to analog-to-digital conversion, and more particularly to analog-to-digital conversion of a signal at radio frequency sampling rates.

The role of telecommunications continues to grow in today's world. This is true not only in business settings (where communications are very often vital), but also in the day-to-day lives of individuals. With the advent of mobile communications (e.g., cellular telephone systems), individuals with hectic lifestyles find that they are more and more dependent on their personal communication devices to keep in touch with business associates as well as with friends and family.

Because of this increased dependence, the drive to make mobile communication devices more flexible and more reliable grows steadily. Research continues in an effort to reduce the size and power consumption of portable communications devices, in order to make them more convenient to carry while increasing their useful life between recharging.

In an effort to accomplish these goals, the trend has been to substitute digital technology for analog technology. In addition to achieving the goals of reduced size and power consumption, the substitution of digital technology for analog technology has resulted in increased quality of service because analog components are very often responsible for introducing problems like nonlinearities, distortions and spurious reception. Spurious reception is caused by mixing a higher harmonic of a spurious signal with a higher harmonic of the local oscillator, thereby generating a signal close to the intermediate frequency, $f_{IF}$:

$$f_{IF} \approx |m \cdot f_{SP} - n \cdot f_{LO}|$$

where $f_{SP}$ is the spurious signal's frequency, $f_{LO}$ is the local oscillator frequency, and m and n are the order of the signal and the local oscillator harmonic, respectively. Solving for $f_{SP}$ gives:

$$f_{SP} \approx \pm \frac{1}{m} f_{IF} + \frac{n}{m} \cdot f_{LO}$$

where the positive sign holds if the local oscillator frequency is above that of the wanted signal, and the negative sign occurs if it is below that of the wanted signal.

Despite the desire to utilize digital technology as much as possible, state of the art receivers continue to include one or two analog Intermediate Frequency (IF) stages before the signal is sampled by a multi-bit analog-to-digital (A/D) converter. The reason for this is that radio frequencies intended to be used for mobile radio applications are in the range of 1 or 2 gigahertz or above. Because conventional multi-bit A/D-converters are characterized by a limited input bandwidth, sampling at the radio frequency (RF) rate has not been possible. And, without A/D conversion, analog technology is the only means available for initially processing the received RF signal.

S. Yang, et. al., "A tunable bandpass sigma-delta A/D conversion for mobile communication receiver," 1994 IEEE 44th *Vehicular Technology Conference*, pp. 1346–1350, vol. 2 (1994) describes a receiver with one analog downconversion and techniques for tuning such a receiver by means of sigma-delta modulation.

SUMMARY

It is therefore an object of the present invention to provide improved methods and apparatuses for reception of radio frequency signals.

In accordance with one aspect of the present invention, the foregoing and other objects are achieved in a radio receiver that receives a radio frequency signal, and uses sigma-delta analog-to-digital conversion techniques that sample the radio frequency signal at a sampling rate and generates therefrom 1-bit digital samples representing an intermediate frequency signal. Whether or not the sampling rate is at, above or below the Nyquist rate of the radio frequency signal, the sampling rate is preferably many times higher than the signal bandwidth. Having generated the intermediate frequency signal, demodulation is then used to generate in-phase and quadrature samples from the intermediate frequency signal. An advantage of this technique is that demodulation may be performed in a purely digital manner.

In another aspect of the invention, the intermediate frequency is a difference between the radio frequency and a closest harmonic of the sampling rate.

In some embodiments, demodulation comprises generating a first mixed signal by combining the 1-bit digital samples representing the intermediate frequency signal with a first sequence representing a cosine mixing signal; and generating a second mixed signal by combining the 1-bit digital samples representing the intermediate frequency signal with a second sequence representing a sine mixing signal. The first and second mixed signals are then decimated to generate the in-phase and quadrature samples. In these embodiments, the intermediate frequency may be one fourth of the sampling rate.

In yet another aspect of the invention, exclusive-OR logic gates may be used to generate the first and second mixed signals.

In still another aspect of the invention, demodulation may alternatively be performed by receiving the 1-bit digital samples representing the intermediate frequency signal and generating therefrom first and second decimated signals, wherein: the first decimated signal is based on the 1-bit digital samples; the second decimated signal is based on a time-shifted version of the 1-bit digital samples; each of the first and second decimated signals has one sample for every number, N, of 1-bit digital samples representing the intermediate frequency; and the time-shifted version of the 1-bit digital samples is the 1-bit digital samples delayed by an amount, Δn cycles of the sampling rate. Δn may represent an odd multiple of a quarter period of the intermediate frequency. The first and second decimated signals are then bandpass filtered to generate the respective in-phase and quadrature samples.

In yet another aspect of the invention, demodulation may alternatively be performed by considering the intermediate frequency to be a first intermediate frequency, and bandpass filtering and decimating the intermediate frequency signal to generate a digital signal having a second intermediate frequency. A demodulator is then used for reconstructing the in-phase and quadrature samples from the digital signal having the second intermediate frequency. In these embodiments, the bandpass filtering as a bandpass characteristic around the first intermediate frequency.

BRIEF DESCRIPTION OF THE DRAWINGS

The objects and advantages of the invention will be understood by reading the following detailed description in conjunction with the drawings in which.

DETAILED DESCRIPTION

Figure 1B:
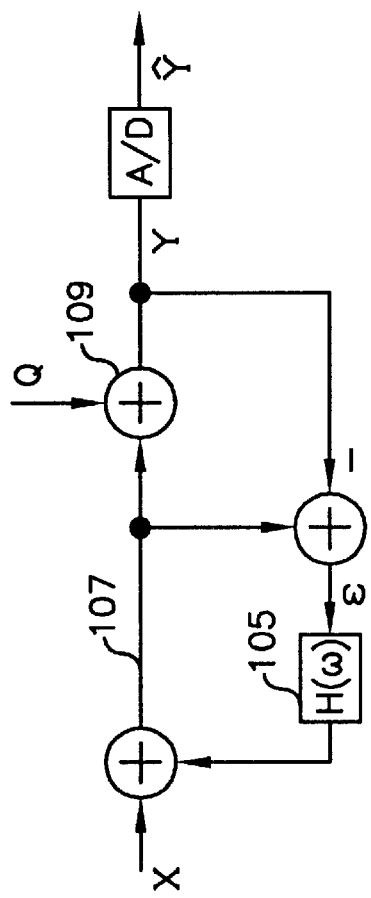
FIG. 1b is an equivalent model of the same converter.

The various features of the invention will now be described with respect to the figures, in which like parts are identified with the same reference characters.

Radio frequency sampling in the gigahertz range is feasible with one-bit A/D converters that can be built with commercially available high speed logic components. Such sampling enables the analog circuitry of conventional receivers to be replaced by digital circuitry, thereby obtaining the various benefits described in the BACKGROUND section above. A one-bit A/D converter will exhibit very high quantization noise, however. One technique for reducing this is by digital low pass filtering and decimation, a strategy that exchanges resolution for sample rate.

Figure 1A:
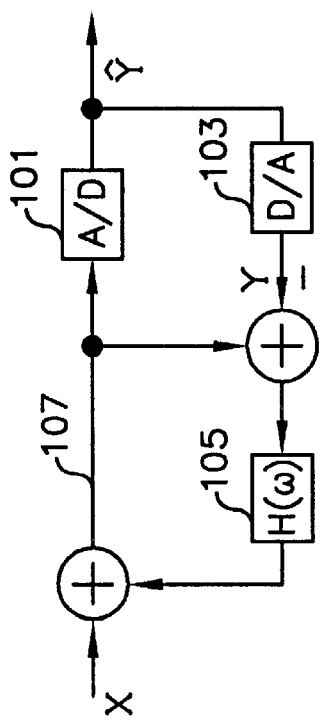
FIG. 1a is a block diagram of a sigma-delta-modulator A/D converter.

As an alternative, the noise performance can be considerably improved by highly oversampling the signal modulated on the RF signal, and then employing a sigma-delta-modulator for noise shaping in order to achieve the required dynamic range for the digitized signal. FIG. 1a shows a block diagram of a sigma-delta-modulator A/D converter, and FIG. 1b shows an equivalent model of the same converter. Looking first at FIG. 1a, an A/D converter 101 is provided to generate a digital signal that is intended to represent an analog input signal, X. In order to reduce the quantization noise in the range of the signal spectrum associated with the digitization process, the output of the A/D converter 101 is supplied to a feedback path, where it is first converted back into an analog signal by means of a D/A converter 103. The resultant analog feedback signal is subtracted from the analog signal 107 that feeds the A/D converter 101. The resultant difference signal is applied to a filter 105 whose output is combined with the input analog signal, X. This combined signal 107 is the analog signal that is supplied to the A/D converter 101.

A better understanding of this process will be gained by referring now to FIG. 1b. In this model of the sigma-delta-modulator A/D converter, the A/D and D/A converters 101 and 103 are replaced by a summing junction 109 that adds a signal representing the quantization noise, Q. Given the analog input signal X, the quantization noise Q, the analog representation, Y, of the output and the digital output signal Ŷ the transfer function of the sigma-delta-modulator A/D converter is:

$$Y=X+(1-H)Q$$

With a suitable filter characteristic, H, in the feedback loop of the sigma-delta-modulator, the quantization noise spectrum can be shaped such that it is suppressed as much as possible at frequencies occupied by the signal spectrum. Techniques for determining the filter characteristic are known, and usually start with a linear approach by setting the noise transfer function $1-H(\omega)$ to some known filter characteristic with a high attenuation in the range of the signal spectrum, such as a bandstop Butterworth, Chebychev or Cauer characteristic. The zeros and poles of $H(\omega)$ can then be derived from this. Since a sigma-delta modulator is a nonlinear device, $H(\omega)$ derived by the linear method is an approximation and should be further optimized by experiments or simulations in the time domain. This is common practice today, since no direct analytical approach is known. Having derived the suitable filter characteristic for the sigma-delta modulator, preferred implementations may utilize passive filters, such as LC or microstrip filters, because of the required high frequency operation.

The corresponding dynamic range increases with the over-sampling ratio (i.e., sample rate divided by twice the signal bandwidth) and the order of the sigma-delta-modulator, which is related to the filter order. For example, a sigma-delta-modulator of fifth order and an over-sampling ratio of 32 results in a 90 dB dynamic range, corresponding to 15 bits. The relationship between the dynamic range, over-sampling ratio and the order of the sigma-delta-modulator is described, for example, in Richard Schreier, "An empirical study of high-order single-bit delta-sigma modulators", IEEE TRANSACTIONS ON CIRCUITS AND SYSTEMS -II: ANALOG AND DIGITAL SIGNAL PROCESSING, vol. 40, No. 8, August 1993, p. 465.

Figure 2:
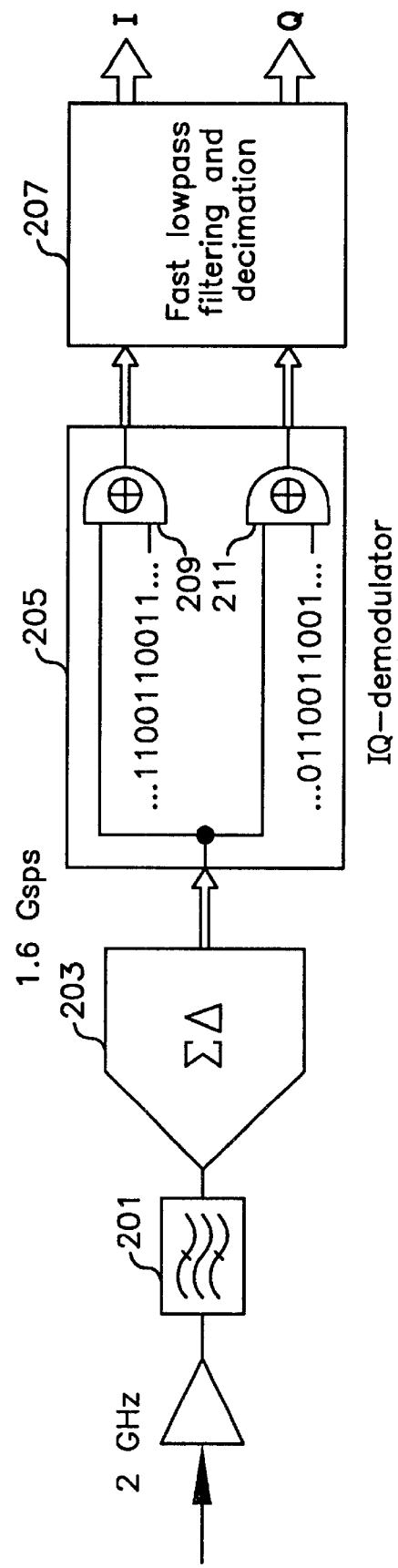
FIG. 2 is a block diagram of a digital receiver structure based on radio frequency sampling by means of a sigma-delta modulator A/D converter in accordance with one aspect of the invention.

FIG. 2 shows a block diagram of a first digital receiver structure based on radio frequency sampling by means of a sigma-delta modulator A/D converter as described above. A radio frequency signal (e.g., a 2 GHz signal) is received and processed by an anti-aliasing filter . The filtered signal is then supplied to a one-bit sigma-delta modulator A/D converter 203. The digital output from the one-bit sigma-delta modulator A/D converter 203 is then further processed by an IQ-demodulator 205 and a fast lowpass/decimation filter 207.

In operation, the one-bit sigma-delta-A/D converter 203 may sub-sample the filtered radio frequency signal (i.e., the filtered radio frequency signal is sampled at less than the Nyquist rate for the radio frequency signal, which would be two times the radio frequency), thus converting the signal to an intermediate frequency in the digital domain that is the difference between the radio frequency and the harmonic of the sample frequency closest to it. Note that the signal modulated on the radio frequency carrier is band-limited, so that even though the radio frequency signal is sub-sampled, the modulating signal is still highly oversampled. For example, given a 5 MHZ signal modulated on a 2 GHz radio frequency carrier, a sampling rate close to the radio frequency would highly oversample the modulating signal even though the radio frequency carrier would be sub-sampled. Of course, sub-sampling of the radio frequency signal is not a requirement. In alternative embodiments, the radio carrier may be sampled above its Nyquist rate, thereby giving even more oversampling of the modulating signal.

Returning now to a discussion of those embodiments in which sub-sampling of the radio frequency carrier is utilized, since the sub-sampled signal is at a non-zero intermediate frequency, a so-called bandpass sigma-delta-modulator is preferably used as part of the one-bit sigma-delta-A/D converter 203. Bandpass sigma-delta-modulators are well-known in the art, and need not be described here in greater detail. The anti-aliasing filter 201 and the IQ-demodulator 205 become most simple when the sampling rate, $F_S$, is chosen to be four times the digital intermediate frequency, $F_{IF}$ (i.e., $F_{IF}=F_S/4$). In this case, the cosine and sine mixing signals are represented by the respective sequences ... 1-1-111-1-11 ... and ... 11-1-111-1-1 ... which, in digital form, correspond to the respective sequences ... 10011001 ... and ... 11001100 .... It can be seen that, although the two sequences have the same form (i.e., two bits of "1" followed by two bits of "−1"), the sequence for the cosine mixing signal leads the sequence for the sine mixing signal by one bit. Together with the one-bit signal from the sigma-delta-A/D converter 203, the multiplication operations in the IQ-demodulator reduce to selectively inverting or not inverting the corresponding signal bits, such as by means of the illustrated logical exclusive-or ("XOR") operations 209, 211.

Two cases have to be distinguished for the digital intermediate frequency. The first is the case in which the m-th harmonic of $f_S$ closest to the radio frequency, $f_{RF}$, is below $f_{RF}$. The second is the case in which the m-th harmonic of $f_S$ closest to the radio frequency, $f_{RF}$, is above $f_{RF}$. For case 1:

$$mf_S < f_{RF} \Rightarrow f_{IF} = \left| \frac{1}{4m+1} f_{RF} \right|$$

and for case 2:

$$mf_S > f_{RF} \Rightarrow f_{IF} = \left| \frac{1}{4m-1} f_{RF} \right|$$

For example, for the first case with $f_{RF}=2$ GHz and m=1 the intermediate frequency is 400 MHZ and the sample rate $f_S=4f_{IF}=1.6$ giga-samples per second (Gsps). With that sample rate, a 20 MHZ wide signal is oversampled with an oversampling ratio of 40.

Figure 3:
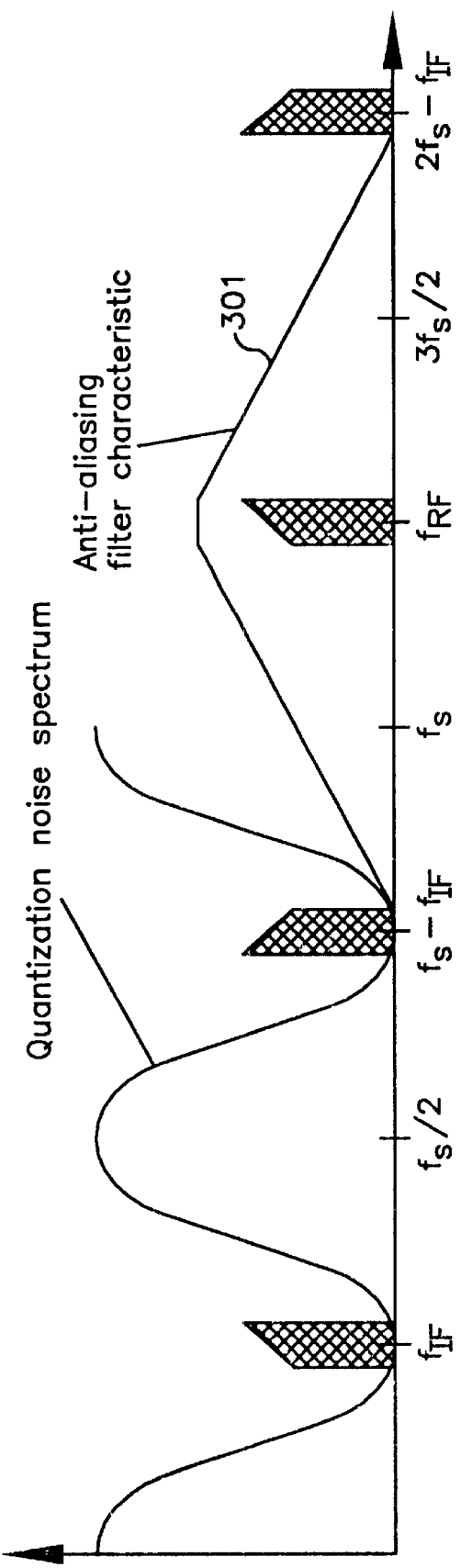
FIG. 3 is a graph of the spectra of signal and quantization noise after sampling.

FIG. 3 shows the spectra of signal and quantization noise after sampling. The bandpass sigma-delta-modulator within the one-bit sigma-delta A/D converter 203 suppresses the quantization noise at the signal frequencies. This makes it possible for the quantization noise to be removed by the lowpass/decimation filter 207 without affecting the signal. Since the harmonics of the signal spectrum are far apart, the characteristic 301 of the analog anti-aliasing filter 201 is rather flat, which is a relatively easy requirement to satisfy.

Principally, then, FIG. 3 illustrates what frequencies can pass through the analog anti-aliasing filter in the front end. The signal with bandwidth B modulated on the radio carrier $f_{RF}$ is converted to the intermediate frequency $f_{IF}$ by the sub-sampling operation. However, all frequencies received within the signal bandwidth located at the harmonics of the radio carrier plus/minus the intermediate frequency $nf_{RF} \pm f_{IF}$, where n=2, 3, ..., are also converted into the wanted signal bandwidth at $f_{IF}$. All of these spectral locations have to be filtered out. Consequently, the anti-aliasing filter at the front-end has to pass the signal spectrum at $f_{RF}$ undisturbed and stop all frequencies below the upper limit of the next "alias band" below (e.g., $f_S-f_{IF+B}/2$ for the example shown in FIG. 3) and above the lower limit of the next "alias band" above (e.g., $2f_S-f_{IF}-B/2$ for the example shown in FIG. 3). This is the equivalent of an image suppression filter found in analog mixer stages of conventional receivers.

In accordance with one aspect of the invention, the multi-bit representation of the analog input signal is obtained, in part, by means of the lowpass/decimation filter 207 that suppresses the shaped noise without affecting the signal. Such a decimation filter faces the problem of high speed. Because of these high demands, preferred embodiments of the invention utilize decimation filter techniques as described in U.S. Pat. No. 6,202,074, filed in the name of Dietmar Lipka, entitled "Multiplierless Digital Filtering", which is hereby incorporated herein by reference in its entirety.

Figure 4A:
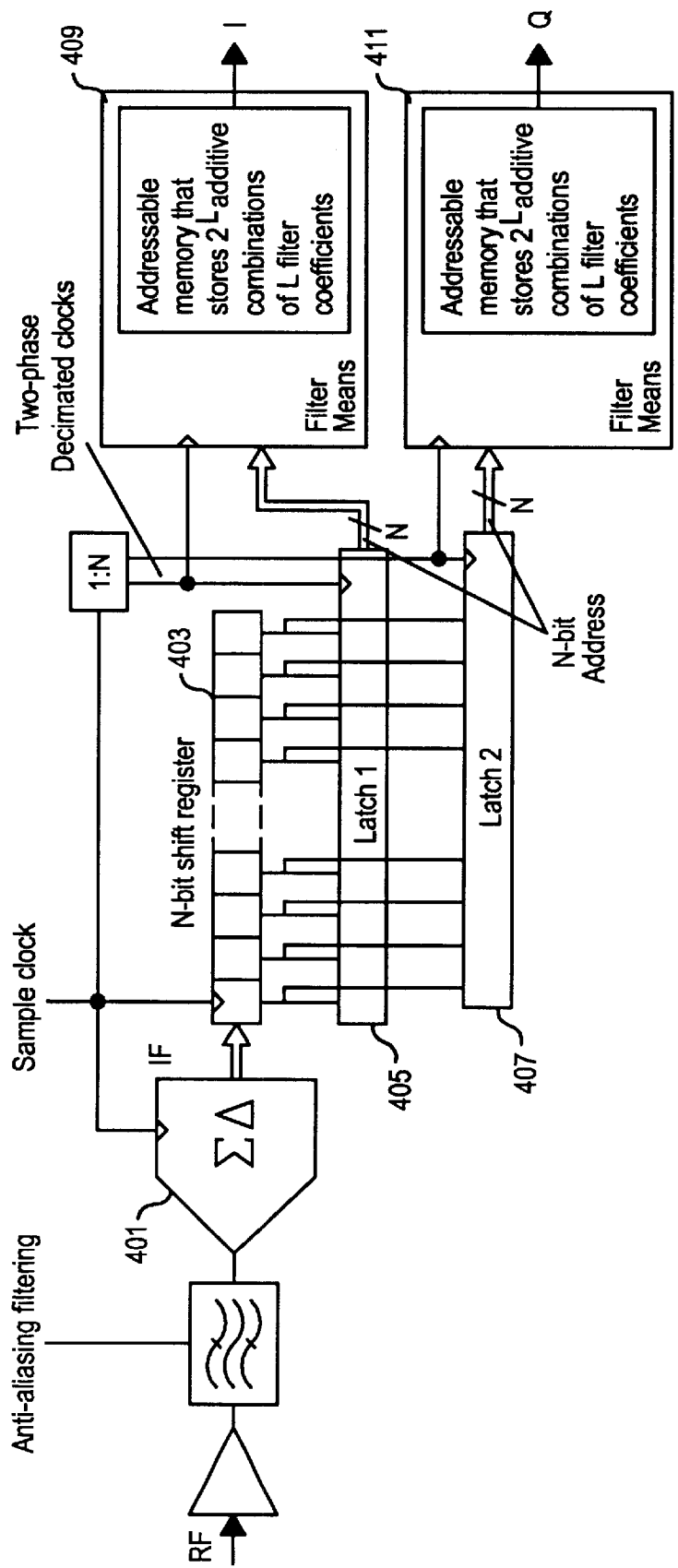
FIGS. 4a and 4b depict alternative embodiments of a digital receiver structure with direct conversion to I and Q by digitally sub-sampling two time-shifted sequences from the sigma-delta-modulator with bandpass decimation filters, in accordance with one aspect of the invention.
Figure 4B:
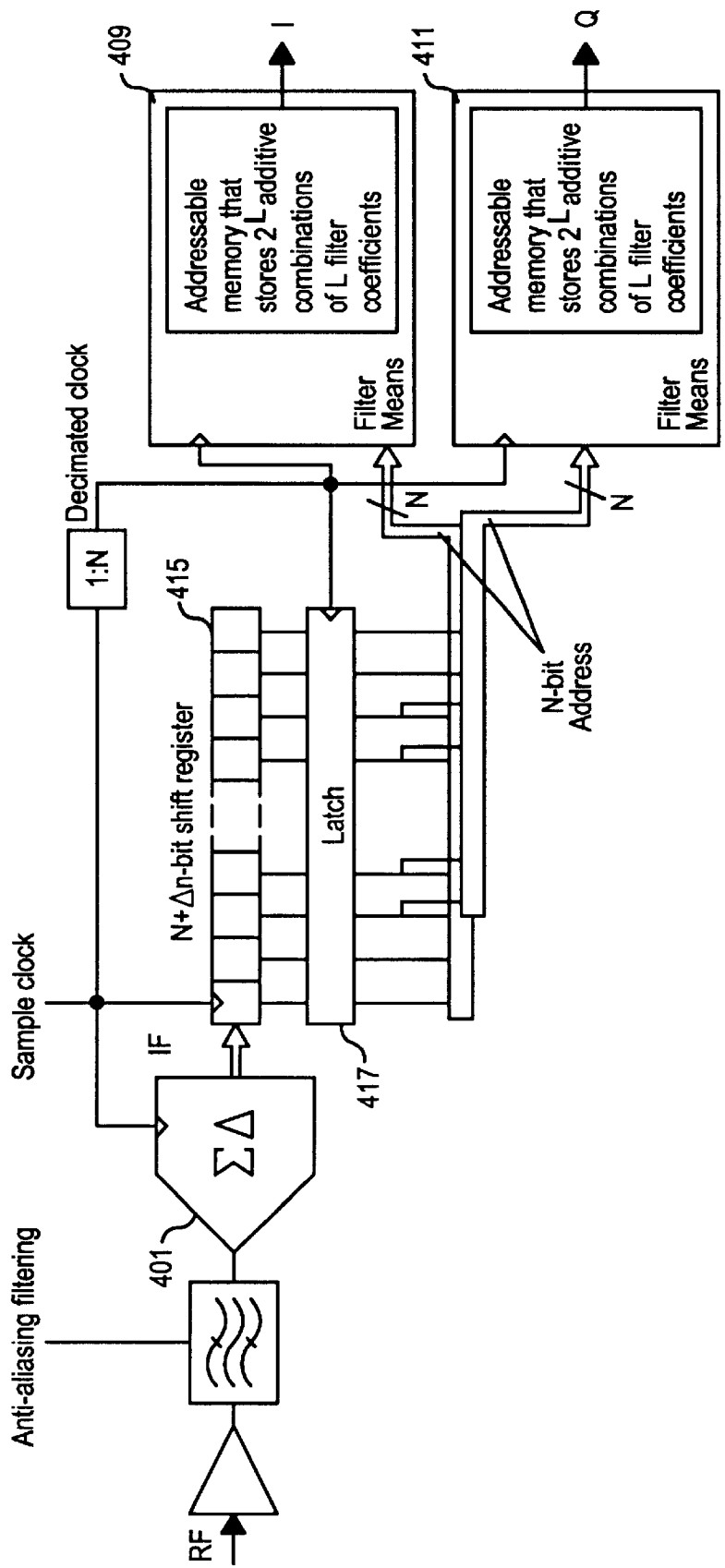

A second digital receiver structure with direct conversion to I and Q by digitally sub-sampling two time-shifted sequences from the sigma-delta-modulator with bandpass decimation filters is shown in FIGS. 4a and 4b. These embodiments differ from the one shown in FIG. 2 in that the digital intermediate frequency need not be restricted to the case in which $f_{IF}=f_S/4$.

Assume first that the relationship between the intermediate frequency and the sampling rate is arbitrary: $f_{IF}=f_S/x$. Direct conversion to either the I or Q signal is obtained by sub-sampling, that is, decimating, the signal in the digital domain with a sub-multiple of $f_{IF}$ given as $f_D=f_{IF}/k=f_S/(kx)$, where $f_D$ is the sub-sampling rate in the digital domain and k=1, 2, 3, .... The I and Q components can be separated by generating two sub-sampled sequences that are mutually time shifted with respect to one another by an odd numbered multiple of one fourth of an intermediate frequency period $T_{IF}=1/f_{IF}$: $\tau=(2l+1) T_{IF}/4$, l=0, 1, 2, .... It then follows that the two sequences have to be shifted by an amount $\Delta n=\tau/T_S=(2l+1)x/4$ sample points with respect to one another, where $T_S=1/f_S$. Since $\Delta n$ has to be an integer value, x is restricted to being a multiple of 4, expressed here as $x=4\mu$, $\mu=1, 2, 3, \ldots$ With that, the possible intermediate frequencies for case 1 identified above are:

$$mf_S < f_{RF} \Rightarrow f_{IF} = \left| \frac{1}{4m\mu+1} f_{RF} \right|$$

and for case 2, the possible intermediate frequencies are:

$$mf_S > f_{RF} \Rightarrow f_{IF} = \left| \frac{1}{4m\mu-1} f_{RF} \right|$$

If the intermediate frequency is determined with these formulas, the sampling rate of the sigma-delta-modulator is calculated by $f_S=4\mu f_{IF}$ and the number of one-bit sample cycles between the decimated I and Q signal data points is calculated by $\Delta n=(2l+1)\mu$.

The combined bandpass decimation filtering and IQ-demodulation is implemented utilizing decimation filter techniques described in the above-mentioned U.S. Pat. No. 6,202,074, entitled "Multiplierless Digital Filtering", which is incorporated herein by reference in its entirety. Generally, decimation by N in this filter may be accomplished with a shift register that reads the one-bit samples from the sigma-delta-modulator. Each time a number of N 1-bit input data samples has been (sequentially) loaded into the shift register, a block of data samples is clocked into a latch. The latched bits are then fed into a filter structure running at the decimated clock rate. The filter structure may comprise, for example, a memory or a cascade of memories whose outputs are added, yielding the filtered signal. The memories contain additive combinations of the filter coefficients. Where the filter order, L, is larger than the number of latched bits supplied to the filter structure (i.e., is larger than the size of a presently received decimated data signal), the filter structure may include one or more cascade-connected latches for storing earlier-received decimated data signals. A number of alternative embodiments of the decimation filter techniques are described in the above-mentioned "Multiplierless Digital Filtering" patent application, any one of which could easily be adapted for use in conjunction with the techniques described here.

Utilizing these principles, the two mutually time-shifted sequences can be obtained by several alternative methods. In one embodiment, as illustrated in FIG. 4a, a sigma-delta A/D converter 401 supplies its 1-bit output to an N-bit shift register 403, which clocks in the bits at the fast sampling clock rate, $f_S$. First and second latches, 405 and 407, are each coupled to receive N-bit wide data from the N-bit shift register 403. The first and second latches 405 and 407 are clocked by means of respective ones of two phases of the decimated clock. The offset between the two phases of the decimated clock is Δn cycles of the fast sampling clock $f_S$. In alternative embodiments, the N-bit shift register 403 and first and second latches 405 and 407 may be expanded to a length of L, in order to effect higher-order filtering without affecting the amount of decimation.

Focusing again on the embodiment illustrated in FIG. 4a, the first and second latches 405 and 407 supply their outputs to respective ones of first and second cascaded bandpass filter structures 409, 411. The output of the first cascaded bandpass filter structure 409 is the in-phase signal, I, and the output of the second cascaded bandpass filter structure 411 is the quadrature signal, Q. Each of the cascaded bandpass filter structures 409, 411 may include a memory or a cascade of memories whose outputs are combined (e.g., added), yielding the filtered signal. The memory or memories contain additive combinations of the filter coefficients. For a filter of order L, with L≧N, the first and second cascaded bandpass filter structures 409, 411 may include cascade-connected latches for storing earlier received bits. The outputs from the cascade-connected latches are, in this case, supplied for use in addressing the one or more memories.

In an alternative embodiment, as shown in FIG. 4b, one latch 417 is utilized rather than the two latches 405, 407. In this case, the shift register 415 and the latch 417 are each N+Δn bits wide. In the illustrated embodiment, Δn=2, but of course this need not be the case for all embodiments. The least-significant N bits (i.e., the first N bits 1, . . . N) are supplied to a first cascaded bandpass filter structure 409, and the most-significant N bits (i.e, the last N bits Δn+1, . . . N+Δn) are supplied to a second cascaded bandpass filter structure 411. These two groups of bits are processed synchronously by the two cascaded bandpass filter structures 409, 411. The latch 417 and the first and second cascaded bandpass filter structures 409, 411 are each clocked with a decimated version (i.e., decimation ratio of 1:N) of the fast sampling clock, $f_S$.

The techniques illustrated in FIG. 4b may be applied to filters of order L. One possibility is for the shift register 415 and the latch 417 to each be L+Δn bits wide and with the decimated clock still specified to occur once for every N assertions of the fast sampling clock rate. Other possibilities include the use of the illustrated N+Δn-bit wide shift register 415 and latch 417 in conjunction with cascade-connected latches (not shown) located within each of the first and second filter structures 409, 411. Each of the cascade-connected latches would store earlier-received data bits (clocked at the decimated clock rate), and would supply these stored bits (at the decimated clock rate) to an address input port of a memory device, as explained more fully in the above-identified "Multiplierless Digital Filtering" patent application.

For each of the embodiments illustrated in FIGS. 4a and 4b, the filters 409, 411 have to be designed as bandpass filters for the signals at the intermediate frequency in order to remove the quantization noise around it. The cascaded bandpass filters 409, 411 deliver the respective I and Q signals at the decimated rate. The fact that the I and Q signals belong to different time instants must be considered. For high decimation factors, this timing error can be neglected. Otherwise, proper time alignment can be achieved with a subsequent interpolator.

Figure 5:
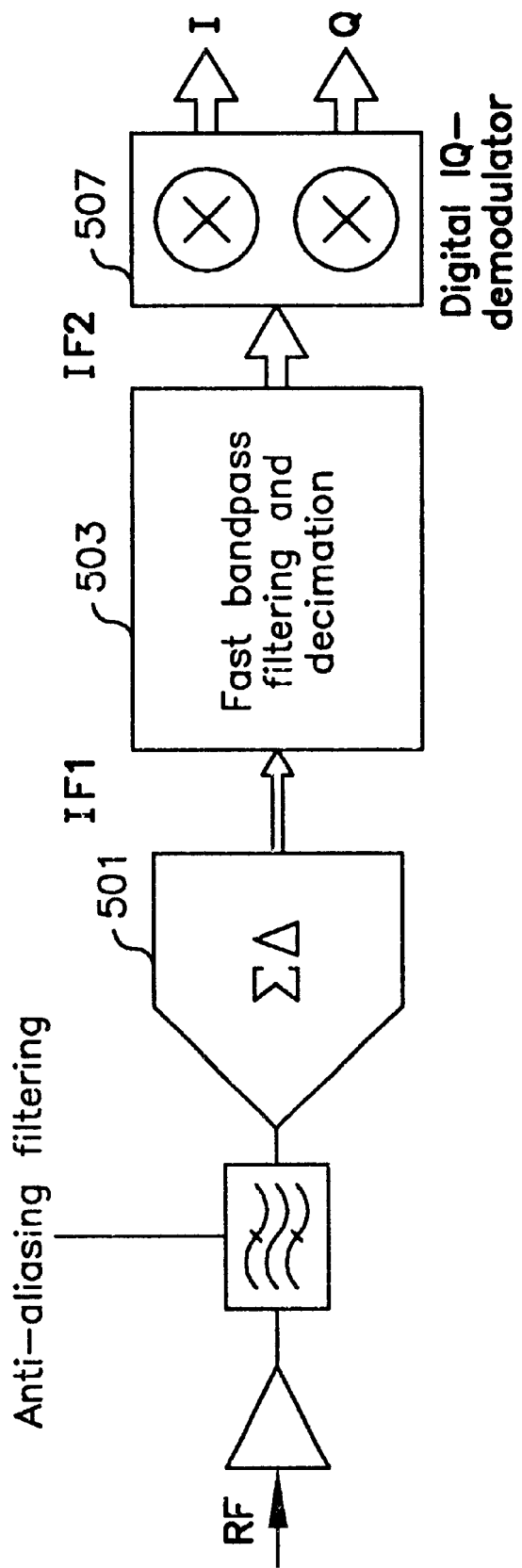
FIG. 5 is a block diagram of a digital double superheterodyne receiver structure having two intermediate frequencies in the digital domain in accordance with another aspect of the invention.

In yet another aspect of the invention, a third digital receiver structure is shown in FIG. 5. The structure has two intermediate frequencies in the digital domain and can thus be regarded as a digital double superheterodyne. The signal is converted to the first intermediate frequency by the sampling performed by the sigma-delta A/D converter 501. The second intermediate frequency, IF2, results from the decimation process in the decimation filter 503. Let D be the decimation factor of the digital bandpass decimation filter, where D is an integer number, $f_S/D$ is the decimated sampling rate and $k \cdot f_S/D$ is the k-th harmonic of the decimated sampling rate, where k=1, 2, . . . Then IF2 is the difference between IF1 and the nearest harmonic $k \cdot f_S/D$. In practice, $f_{RF}$ is given and D and $f_S$ have to be chosen appropriately. D and $f_S$ have to be arranged to obtain a value of IF2 such that demodulation of I- and Q-signals is possible. Furthermore, it is advantageous if IF1 is as close as possible to $f_S/4$, in other words, to relax the requirements for the anti-aliasing filter. (In this case the alias frequencies where unwanted signals are converted to IF1 (spurious reception) are more equidistantly located on the frequency axis, that is with maximum distance with respect to each other as illustrated in FIG. 3). The decimation filter 503 has a bandpass characteristic around IF1. A digital IQ-demodulator 507 receives the output from the bandpass and decimation filter 503, and reconstructs the I and Q signals from the second digital IF signal. In general, this IQ-demodulator 507 performs full multiplications, but can be simplified if IF2 is one fourth of the decimated sampling frequency.

Figure 6:
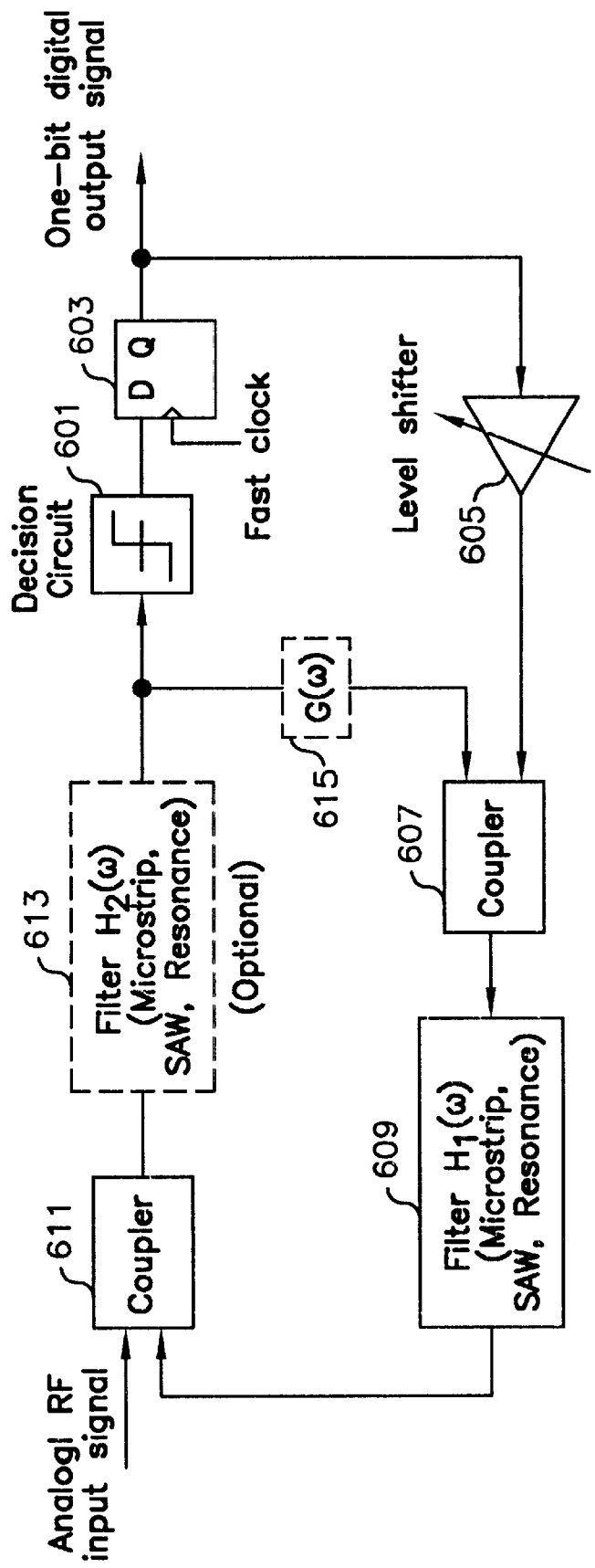
FIG. 6 shows an exemplary hardware implementation of a fast sigma-delta-modulator A/D converter that is suitable for use with the receivers, in accordance with another aspect of the invention.

The clock rate of the sigma-delta-A/D converter is in the gigahertz range for all receiver structures described above. In accordance with another aspect of the invention, FIG. 6 shows an exemplary hardware implementation of a fast sigma-delta-modulator A/D converter that is suitable for use with these receivers. The one-bit A/D converter portion can be realized with a decision device 601 having an output coupled to the data input port of a flip-flop 603. The flip-flop 603 is clocked at the fast sampling rate, $f_S$. The output from the flip flop 603 supplies the 1-bit digital output signal from the sigma-delta A/D converter.

In a first feedback path, a level shifter 605 is provided for use as a one-bit D/A converter. The level shifter 605 is coupled to receive the 1-bit digital output signal from the flip-flop 603. The upper and lower output voltage of the level shifter 605 determines the input voltage range of the sigma-delta-A/D converter. Consequently, if the level shifter 605 is adjustable, it can be used for gain control.

The analog part consists of couplers and one or more filters. A first coupler 607 combines the analog output from the level shifter 605 with a second analog signal that is derived from the analog signal that is supplied to the input of the decision device 601. An optional first filter 615 having a transfer function G(ω) may be included to process the second analog signal prior to its being supplied to the coupler 607.

The output of the first coupler 607 is supplied to a second filter 609, that is also in the feedback path. This second filter 609 may be realized with a micro-strip filter. In alternative embodiments, SAW, resonator or even LC filters may be used instead.

A second coupler 611 is provided in the forward path of the sigma-delta A/D converter. The second coupler 611 combines the analog RF input signal with the analog signal supplied at the output of the second filter 609. The output signal of the second coupler 611 may be supplied to the input port of the decision device 601.

In an alternative embodiment, a third filter 613 is also provided in the forward branch, between the second coupler 611 and the decision device 601. Where $H_1(\omega)$ is the filter characteristic of the second filter 609, $H_2(\omega)$ is the filter characteristic of the third filter 613, and $G(\omega)$ is the filter characteristic of the first filter 615, the transfer function of the sigma-delta A/D converter is:

$$Y = \frac{H_2}{1 + H_1 H_2 (1 - G)} X + \frac{1 - H_1 H_2 G}{1 + H_1 H_2 (1 - G)} Q.$$

The above-described receiver structures are advantageous in that they greatly reduce the amount of required analog circuitry, compared to conventional designs. This avoids, to a great extent, problems like nonlinearities and distortions because no mixers and intermediate frequency amplifiers are needed. Due to the inherent linearity of the sigma-delta-A/D converter, spurious reception is nonexistent. The high sampling rate is beneficial because it imposes the least requirements on the anti-aliasing filter. Due to their essentially digital function, these receivers are highly integratable, thus having the potential for smallest size, lowest power consumption and high reliability. Furthermore, they can be flexibly adapted to all standards by simply changing digital signal processing. In addition, an automatic gain control can be provided that requires simple circuitry because the level shifter 605 in the feedback loop need switch only between two voltage levels. Due to the low number of required components, this type of receiver is also a low cost solution.

The various receivers described herein can each be used as a wideband receiver, such as for Wideband Code Division Multiple Access (W-CDMA). They may also be used for all narrow band standards in mobile communication.

The invention has been described with reference to a particular embodiment. However, it will be readily apparent to those skilled in the art that it is possible to embody the invention in specific forms other than those of the preferred embodiment described above. This may be done without departing from the spirit of the invention.

Figure 7:
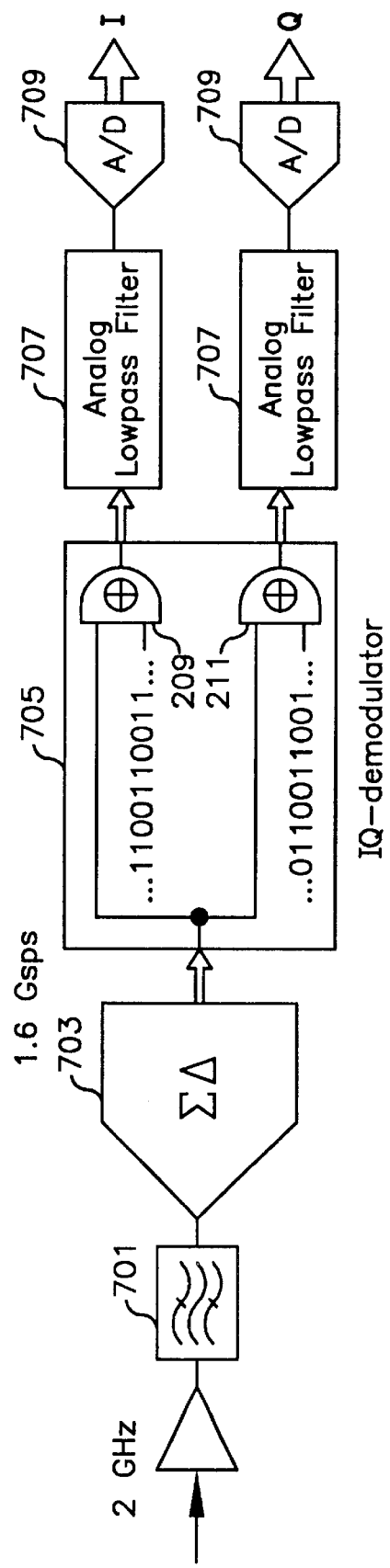
FIG. 7 is a block diagram of an alternative embodiment of a digital receiver structure based on radio frequency sampling by means of a sigma-delta modulator A/D converter in accordance with one aspect of the invention.

For example, FIG. 7 is a block diagram of yet another receiver structure in accordance with an aspect of the invention. As with the receiver depicted in FIG. 2, a radio frequency signal (e.g., a 2 GHz signal) is received and processed by an anti-aliasing filter 701. The filtered signal is then supplied to a one-bit sigma-delta modulator A/D converter 703. The digital output from the one-bit sigma-delta modulator A/D converter 703 is then further processed by an IQ-demodulator 705. However, in place of the digital decimation filter of FIG. 2, the in-phase (I) and quadrature (Q) outputs from the IQ-demodulator 705 are supplied to respective ones of first and second analog lowpass filters 707. The 1-bit data streams from the IQ-demodulator 705 can either be regarded as digital or (if the waveform of the output gate is taken into account) as analog. These signals are composed of the respective baseband I and Q signals and quantization noise. Thus, as an alternative to a digital decimation filter, the quantization noise in the I and Q signals can also be suppressed by respective ones of the first and second analog filters 707. The output signals from the first and second filters 707 have only the bandwidth of the baseband I and Q signals and can be sampled at a low rate with conventional first and second analog-to-digital converters 709. The combination of the sigma-delta-A/D converter with the 1-bit IQ-demodulator 705 can be regarded as linear direct conversion. A drawback with respect to the digital decimation filter is that the I and Q signals have an offset. This offset, however, can be removed by means of digital signal processing.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A receiver, comprising:
    means for receiving a radio frequency signal;
    a sigma-delta analog-to-digital converter that samples the radio frequency signal at a sampling rate and generates therefrom 1-bit digital samples representing a digital intermediate frequency signal, wherein the intermediate frequency is one fourth of the sampling rate; and
    a demodulator for generating in-phase and quadrature samples from the digital intermediate frequency signal, wherein the demodulator comprises:
        a first mixer that generates a first mixed signal by combining the 1-bit digital samples representing the digital intermediate frequency signal with a first sequence representing a cosine mixing signal, wherein the first mixer is a first exclusive-OR logic gate having a first input coupled to receive the 1-bit digital samples representing the digital intermediate frequency signal, and a second input coupled to receive the first sequence representing the cosine mixing signal;
        a second mixer that generates a second mixed signal by combining the 1-bit digital samples representing the digital intermediate frequency signal with a second sequence representing a sine mixing signal, wherein the second mixer is a second exclusive-OR logic gate having a first input coupled to receive the 1-bit digital samples representing the digital intermediate frequency signal, and a second input coupled to receive the second sequence representing the sine mixing signal; and
    means for decimating the first and second mixed signals to generate the in-phase and quadrature samples.

2. The receiver of claim 1, wherein the sampling rate is lower than twice the maximum frequency present in the radio frequency signal.

3. The receiver of claim 1, wherein the intermediate frequency is a difference between the radio frequency and a closest harmonic of the sampling rate.

4. The receiver of claim 1, wherein said radio frequency signal is modulated in the GHz frequency range and wherein said sigma-delta analog-to-digital converter samples said radio frequency signal at a sampling rate in the gigasamples per second (Gsps) range.

5. A receiver, comprising:

means for receiving a radio frequency signal;

a sigma-delta analog-to-digital converter that samples the radio frequency signal at a sampling rate and generates therefrom 1-bit digital samples representing a digital intermediate frequency signal; and a demodulator for generating in-phase and quadrature samples from the digital intermediate frequency signal, wherein the demodulator comprises:

decimation means for receiving the 1-bit digital samples representing the digital intermediate frequency signal and generating therefrom first and second decimated signals, wherein:

the first decimated signal is based on the 1-bit digital samples;

the second decimated signal is based on a time-shifted version of the 1-bit digital samples;

each of the first and second decimated signals has one sample for every number, N, of 1-bit digital samples representing the intermediate frequency; and the time-shifted version of the 1-bit digital samples is the 1-bit digital samples delayed by an amount, $\Delta n$ cycles of the sampling rate; and means for bandpass filtering the first decimated signal to generate the in-phase samples, and for bandpass filtering the second decimated signal to generate the quadrature samples.

6. The receiver of claim 5, wherein the decimation means comprises:

a shift register, coupled to receive the 1-bit digital samples at the sampling rate;

means for generating first and second decimated clocks that are mutually time-shifted with respect to one another by an amount $\Delta n$ cycles of the sampling rate, wherein each of the first and second decimated clocks generates one clock cycle for every N cycles of the sampling rate;

a first latch having a data input coupled to receive an output from the shift register, a clock input coupled to receive the first decimated clock, and an output port for supplying the first decimated signal; and a second latch having a data input coupled to receive the output from the shift register, a clock input coupled to receive the second decimated clock, and an output port for supplying the second decimated signal.

7. The receiver of claim 6, wherein the means for bandpass filtering the first decimated signal to generate the in-phase samples, and for bandpass filtering the second decimated signal to generate the quadrature samples comprises:

at least one addressable memory having an address port coupled to receive at least one of the first and second decimated signals, and having stored therein additive combinations of L filter coefficients, wherein each combination of the L filter coefficients corresponds to one of $2^L$ possible values of a number, L, of received 1-bit digital samples.

8. The receiver of claim 5, wherein the decimation means comprises:

a $(P+\Delta n)$-bit shift register, coupled to receive the 1-bit digital samples at the sampling rate, wherein P is an integer;

means for generating a decimated clock that has one clock cycle for every N cycles of the sampling rate;

a $(P+\Delta n)$-bit latch having a data input coupled to receive a $(P+\Delta n)$-bit wide output from the $(P+\Delta n)$-bit shift register, a clock input coupled to receive the decimated clock, and a $(P+\Delta n)$-bit output port;

means for supplying a least-significant P-bits from the $(P+\Delta n)$-bit output port as the first decimated signal; and means for supplying a most-significant P-bits from the $(P+\Delta n)$-bit output port as the second decimated signal.

9. The receiver of claim 8, wherein the means for bandpass filtering the first decimated signal to generate the in-phase samples, and for bandpass filtering the second decimated signal to generate the quadrature samples comprises:

at least one addressable memory having an address port coupled to receive at least one of the first and second decimated signals, and having stored therein additive combinations of L filter coefficients, wherein each combination of the L filter coefficients corresponds to one of $2^L$ possible values of a number, L, of received 1-bit digital samples.

10. The receiver of claim 5, wherein the sampling rate is lower than twice the maximum frequency present in the radio frequency signal.

11. The receiver of claim 5, wherein the intermediate frequency is a difference between the radio frequency and a closest harmonic of the sampling rate.

12. The receiver of claim 5, wherein said radio frequency signal is modulated in the GHz frequency range and wherein said sigma-delta analog-to-digital converter samples said radio frequency signal at a sampling rate in the gigasamples per second (Gsps) range.

13. A receiver, comprising:

means for receiving a radio frequency signal;

a sigma-delta analog-to-digital converter that samples the radio frequency signal at a sampling rate and generates therefrom 1-bit digital samples representing a digital intermediate frequency signal, wherein the intermediate frequency is one fourth of the sampling rate; and a demodulator for generating in-phase and quadrature samples from the digital intermediate frequency signal, wherein the demodulator comprises:

a first mixer that generates a first mixed signal by combining the 1-bit digital samples representing the digital intermediate frequency signal with a first sequence representing a cosine mixing signal, wherein the first mixer is a first exclusive-OR logic gate having a first input coupled to receive the 1-bit digital samples representing the digital intermediate frequency signal, and a second input coupled to receive the first sequence representing the cosine mixing signal;

a second mixer that generates a second mixed signal by combining the 1-bit digital samples representing the digital intermediate frequency signal with a second sequence representing a sine mixing signal, wherein the second mixer is a second exclusive-OR logic gate having a first input coupled to receive the 1-bit digital samples representing the digital intermediate frequency signal, and a second input coupled to receive the second sequence representing the sine mixing signal;

analog filter means for filtering the first and second mixed signals to generate in-phase and quadrature signals; and analog-to-digital conversion means for converting the in-phase and quadrature signals into the in-phase and quadrature samples.

14. The receiver of claim 13, wherein the sampling rate is lower than twice the maximum frequency present in the radio frequency signal.

15. The receiver of claim 13, wherein the intermediate frequency is a difference between the radio frequency and a closest harmonic of the sampling rate.

16. The receiver of claim 13, wherein said radio frequency signal is modulated in the GHz frequency range and wherein said sigma-delta analog-to-digital converter samples said radio frequency signal at a sampling rate in the gigasamples per second (Gsps) range.

17. A method receiving a signal, comprising the steps of:
receiving a radio frequency signal;
using a sigma-delta analog-to-digital converter to sample the radio frequency signal at a sampling rate and to generate therefrom 1-bit digital samples representing a digital intermediate frequency signal, wherein the intermediate frequency is one fourth of the sampling rate; and
demodulating the digital intermediate frequency signal to generate in-phase and quadrature samples, wherein the step of demodulating comprises the steps of:
generating a first mixed signal by combining the 1-bit digital samples representing the digital intermediate frequency signal with a first sequence representing a cosine mixing signal, wherein the step of generating the first mixed signal comprises the step of performing an exclusive-OR operation between corresponding ones of the 1-bit digital samples representing the digital intermediate frequency signal, and the first sequence representing the cosine mixing signal;
generating a second mixed signal by combining the 1-bit digital samples representing the digital intermediate frequency signal with a second sequence representing a sine mixing signal, wherein the step of generating the second mixed signal comprises the step of performing an exclusive-OR operation between corresponding ones of the 1-bit digital samples representing the digital intermediate frequency signal, and the second sequence representing the sine mixing signal; and
decimating the first and second mixed signals to generate the in-phase and quadrature samples.

18. The method of claim 17, wherein the sampling rate is lower than twice the maximum frequency present in the radio frequency signal.

19. The method of claim 17, wherein the intermediate frequency is a difference between the radio frequency and a closest harmonic of the sampling rate.

20. The method of claim 17, wherein said radio frequency signal is modulated in the GHz frequency range and wherein said sigma-delta analog-to-digital converter samples said radio frequency signal at a sampling rate in the gigasamples per second (Gsps) range.

21. A method of receiving a signal, comprising the steps of:
receiving a radio frequency signal;
using a sigma-delta analog-to-digital converter to sample the radio frequency signal at a sampling rate and to generate therefrom 1-bit digital samples representing a digital intermediate frequency signal; and
demodulating the digital intermediate frequency signal to generate in-phase and quadrature samples, wherein the step of demodulating comprises the steps of:
receiving the 1-bit digital samples representing the digital intermediate frequency signal and generating therefrom first and second decimated signals, wherein:
the first decimated signal is based on the 1-bit digital samples;
the second decimated signal is based on a time-shifted version of the 1-bit digital samples;
each of the first and second decimated signals has one sample for every number, N, of 1-bit digital samples representing the intermediate frequency; and
the time-shifted version of the 1-bit digital samples is the 1-bit digital samples delayed by an amount, $\Delta n$ cycles of the sampling rate;
bandpass filtering the first decimated signal to generate the in-phase samples; and
bandpass filtering the second decimated signal to generate the quadrature samples.

22. The method of claim 21, wherein the sampling rate is lower than twice the maximum frequency present in the radio frequency signal.

23. The method of claim 21, wherein the intermediate frequency is a difference between the radio frequency and a closest harmonic of the sampling rate.

24. The method of claim 21, wherein said radio frequency signal is modulated in the GHz frequency range and wherein said sigma-delta analog-to-digital converter samples said radio frequency signal at a sampling rate in the gigasamples per second (Gsps) range.

25. A method of receiving a signal, comprising the steps of:
receiving a radio frequency signal;
using a sigma-delta analog-to-digital converter to sample the radio frequency signal at a sampling rate and to generate therefrom 1-bit digital samples representing a digital intermediate frequency signal, wherein the intermediate frequency is one fourth of the sampling rate; and
demodulating the digital intermediate frequency signal to generate in-phase and quadrature samples, wherein the step of demodulating comprises:
generating a first mixed signal by combining the 1-bit digital samples representing the digital intermediate frequency signal with a first sequence representing a cosine mixing signal, wherein the step of generating the first mixed signal comprises the step of performing an exclusive-OR operation between corresponding ones of the 1-bit digital samples representing the digital intermediate frequency signal, and the first sequence representing the cosine mixing signal;
generating a second mixed signal by combining the 1-bit digital samples representing the digital intermediate frequency signal with a second sequence representing a sine mixing signal, wherein the step of generating the second mixed signal comprises the step of performing an exclusive-OR operation between corresponding ones of the 1-bit digital samples representing the digital intermediate frequency signal, and the second sequence representing the sine mixing signal;
using analog filtering steps to filter the first and second mixed signals to generate in-phase and quadrature signals; and
converting the in-phase and quadrature signals into the in-phase and quadrature samples.

26. The method of claim 25, wherein the sampling rate is lower than twice the maximum frequency present in the radio frequency signal.

27. The method of claim 25, wherein the intermediate frequency is a difference between the radio frequency and a closest harmonic of the sampling rate.

28. The method of claim 25, wherein said radio frequency signal is modulated in the GHz frequency range and wherein said sigma-delta analog-to-digital converter samples said radio frequency signal at a sampling rate in the gigasamples per second (Gsps) range.

* * * * *